United States Patent
Bae

(10) Patent No.: US 11,082,020 B2
(45) Date of Patent: Aug. 3, 2021

(54) APPARATUS FOR ATTENUATING NOISE IN VEHICLE AND CONTROL METHOD THEREOF

(71) Applicants: Hyundai Motor Company, Seoul (KR); Kia Motors Corporation, Seoul (KR)

(72) Inventor: Jungnam Bae, Seoul (KR)

(73) Assignees: Hyundai Motor Company, Seoul (KR); Kia Motor Corporation, Seoul (KR)

( * ) Notice: Subject to any disclaimer, the term of this patent is extended or adjusted under 35 U.S.C. 154(b) by 32 days.

(21) Appl. No.: 16/686,655

(22) Filed: Nov. 18, 2019

(65) Prior Publication Data

US 2020/0395910 A1 Dec. 17, 2020

(30) Foreign Application Priority Data

Jun. 17, 2019 (KR) .................. 10-2019-0071492

(51) Int. Cl.
*H03G 3/30* (2006.01)
*H01Q 1/22* (2006.01)
*H03F 1/34* (2006.01)

(52) U.S. Cl.
CPC ............. *H03G 3/3005* (2013.01); *H01Q 1/22* (2013.01); *H03F 1/34* (2013.01)

(58) Field of Classification Search
CPC ........ H03G 3/3005; H03G 3/301; H01Q 1/22; H03F 1/34; H03F 1/347; H04B 1/1082; H04B 1/3822

USPC ................. 381/86, 104, 107, 109, 120, 123; 455/345
See application file for complete search history.

(56) References Cited

U.S. PATENT DOCUMENTS

| | | | | |
|---|---|---|---|---|
| 2,587,697 | A * | 3/1952 | Conrad | G01R 31/2614 330/2 |
| 3,134,080 | A * | 5/1964 | Story | H03F 1/34 330/102 |
| 4,005,354 | A * | 1/1977 | Plant | G01D 5/2066 340/870.32 |
| 4,414,690 | A * | 11/1983 | Nordholt | H03F 3/195 330/102 |
| 4,460,875 | A * | 7/1984 | Harman | H03F 1/345 330/286 |
| 5,777,468 | A * | 7/1998 | Maher | G01D 5/2291 318/657 |
| 6,285,769 | B1 * | 9/2001 | Edelson | H04R 3/002 381/111 |
| 6,628,791 | B1 * | 9/2003 | Bank | H04R 3/00 330/199 |
| 7,863,978 | B1 * | 1/2011 | Danielsons | H03F 3/189 330/79 |

(Continued)

*Primary Examiner* — Xu Mei
(74) *Attorney, Agent, or Firm* — Morgan, Lewis & Bockius LLP

(57) ABSTRACT

A vehicle includes an antenna configured to receive a broadcast signal, an amplifier configured to amplify the broadcast signal, a detector configured to detect an output signal of the amplifier, a variable transformer configured to output a negative feedback signal based on the detected output signal, an auto gain control configured to control an input signal of the amplifier based on the negative feedback signal and a controller configured to control the variable transformer and the auto gain control based on the output signal of the amplifier.

19 Claims, 6 Drawing Sheets

(56) References Cited

U.S. PATENT DOCUMENTS

2006/0245603 A1* 11/2006 Suzuki ................ H03G 1/0088
381/104
2012/0052824 A1* 3/2012 Mirzaei .................. H03F 3/245
455/127.2

* cited by examiner

APPARATUS FOR ATTENUATING NOISE IN VEHICLE AND CONTROL METHOD THEREOF

CROSS-REFERENCE TO RELATED APPLICATION(S)

This application is based on and claims priority to Korean Patent Application No. 10-2019-0071492, filed on Jun. 17, 2019 in the Korean Intellectual Property Office, the disclosure of which is incorporated by reference in its entirety.

TECHNICAL FIELD

The present disclosure relates to a vehicle and a control method thereof, and more particularly, to a vehicle and a control method thereof capable of attenuating intermodulation.

BACKGROUND

In general, a vehicle is a moving means or a transportation means that travels on a road using fossil fuels, electricity, or the like as a power source.

A vehicle can be considered as a space in which a driver can rest beyond the means of transportation. In such a vehicle, audio and/or video systems are also installed to provide comfort and relaxation for the driver. A driver can listen to music/radio or watch video through the audio and/or video system.

In general, radio signals of various frequencies are radiated in the city center, and thus, audio and video broadcasts are often distorted by radio signals of different frequencies. Particularly, when intermodulation noise is generated by intermodulation between radio signals of different frequencies, it is very difficult to block the intermodulation noise by using a bandpass filter.

SUMMARY

An aspect of the present disclosure is to provide a vehicle and a control method thereof capable of attenuating by identifying an electric load consuming a current in a parking state.

Another aspect of the present disclosure is to provide a vehicle and a control method thereof capable of attenuating noise while maintaining a signal-to-noise ratio.

In accordance with an aspect of the present disclosure, a vehicle includes: an antenna configured to receive a broadcast signal; an amplifier configured to amplify the broadcast signal; a detector configured to detect an output signal of the amplifier; a variable transformer configured to output a negative feedback signal based on the detected output signal; an auto gain control configured to control an input signal of the amplifier based on the negative feedback signal; and a controller configured to control the variable transformer and the auto gain control based on the output signal of the amplifier.

The variable transformer may convert the detected output signal into the negative feedback signal based on a conversion ratio by the control signal of the controller.

The controller may change the conversion ratio of the variable transformer based on the output signal of the amplifier.

If a magnitude of the output signal of the amplifier is greater than a reference value, the controller may change the conversion ratio of the variable transformer depending on the magnitude of the output signal of the amplifier, and if the magnitude of the output signal of the amplifier is not greater than the reference value, the controller may control the variable transformer such that the conversion ratio of the variable transformer is reduced.

The auto gain control may adjust the input signal of the amplifier such that the detected output signal is not saturated.

The controller may activate or deactivate the auto gain control based on the output signal of the amplifier.

If the magnitude of the output signal of the amplifier is greater than a reference value, the controller activates the auto gain control, and if the magnitude of the output signal of the amplifier is not greater than the reference value, the controller may deactivate the auto gain control.

The variable transformer may include an input inductor and an output inductor magnetically correlated to each other, and inductance values of the input inductor and the output inductor may be changed in response to the control signal of the controller.

The variable transformer may include: a plurality of input switches each connected to one end of the input inductor and a middle portion of the input inductor; and a plurality of output switches each connected to one end of the output inductor and a middle portion of the output inductor.

In response to the control signal of the plurality of the input switches of the controller and the plurality of the output switches of the controller, the inductance values of the input inductor and the output inductor, respectively, may be changed depending on an operation of the plurality of input switches and the plurality of output switches.

The controller may adjust gain of the amplifier based on the negative feedback signal.

The controller may adjust the gain of the amplifier based on the negative feedback signal, and changes the conversion ratio of the variable transformer based on the gain control of the amplifier.

In accordance with another aspect of the present disclosure, a control method of a vehicle includes: receiving a broadcasting signal; amplifying the broadcasting signal by an amplifier; detecting an output signal of the amplifier; converting the output signal of the amplifier to a negative feedback signal by a variable transformer; and adjusting an input signal of the amplifier in response to a negative feedback signal.

The converting may include converting the output signal of the amplifier to the negative feedback signal based on a conversion ratio determined from the output signal of the amplifier.

The converting may include changing the conversion ratio of the variable transformer depending on the magnitude of the output signal of the amplifier if the magnitude of the output signal of the amplifier is greater than a reference value, and controlling the conversion ratio of the variable transformer is a minimum value if the magnitude of the output signal of the amplifier is not greater than the reference value.

The variable transformer may include an input inductor and an output inductor magnetically correlated to each other, and the inductance value of the input inductor and the inductance value of the output inductor may change depending on an operation of the plurality of input switches and the plurality of output switches.

The variable transformer may include: a plurality of input switches each connected to one end of the input inductor and a middle portion of the input inductor; and a plurality of output switches each connected to one end of the output inductor and a middle portion of the output inductor, and converting the output signal of the amplifier to the negative feedback signal may include changing the inductance values of the input inductor and the output inductor.

The adjusting may include adjusting the input signal of the amplifier such that the output signal is not saturated.

The adjusting may include activating or deactivating an auto gain control based on the output signal of the amplifier.

The auto gain control may be activated if the magnitude of the output signal of the amplifier is greater than a reference value, and the auto gain control may be deactivated if the magnitude of the output signal of the amplifier is not greater than the reference value.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
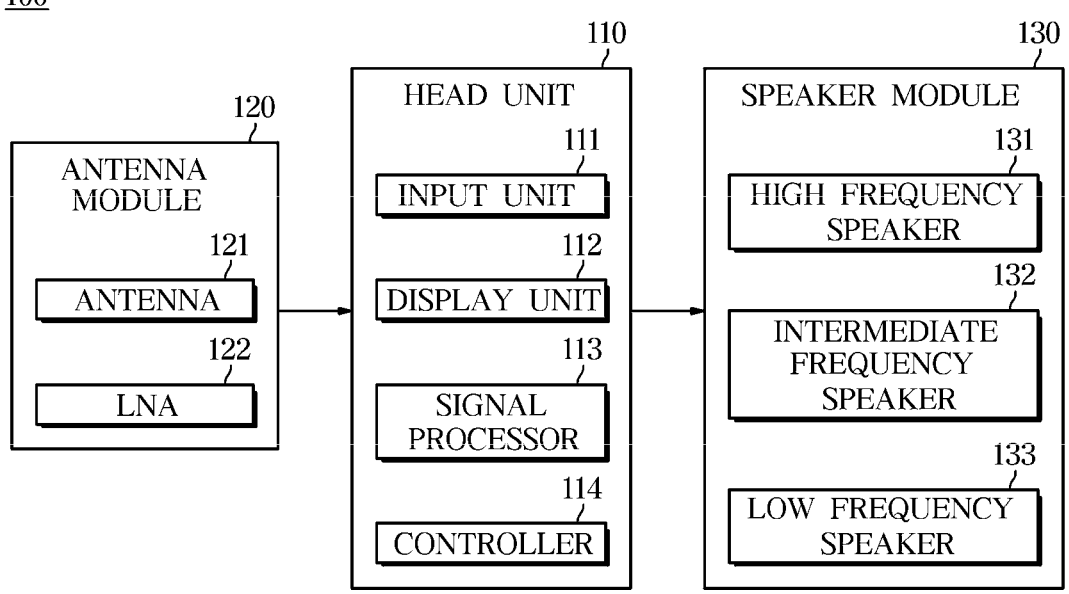
FIG. 1 is a block diagram of an audio device included in a vehicle according to an exemplary embodiment of the present disclosure.

Reference will now be made in detail to the embodiments of the present disclosure, examples of which are illustrated in the accompanying drawings, wherein like reference numerals refer to like elements throughout. This specification does not describe all elements of the embodiments of the present disclosure and detailed descriptions on what are well known in the art or redundant descriptions on substantially the same configurations may be omitted.

Throughout the specification, when an element is referred to as being "connected to" another element, it may be directly or indirectly connected to the other element and the "indirectly connected to" includes being connected to the other element via a wireless communication network.

It is to be understood that the terms "include" and "have" are intended to indicate the existence of elements disclosed in the specification, and are not intended to preclude the possibility that one or more other elements may exist or may be added.

An expression used in the singular encompasses the expression of the plural, unless it has a clearly different meaning in the context.

The terms 'unit, module, member, and block' used herein may be implemented using a software or hardware component. According to exemplary embodiments, a plurality of 'units, modules, members, or blocks' may also be implemented using an element and one 'unit, module, member, or block' may include a plurality of elements.

The reference numerals used in operations are used for descriptive convenience and are not intended to describe the order of operations and the operations may be performed in a different order unless otherwise stated.

Hereinafter, embodiments of the present disclosure will be described in detail with reference to the accompanying drawings.

Figure 2:
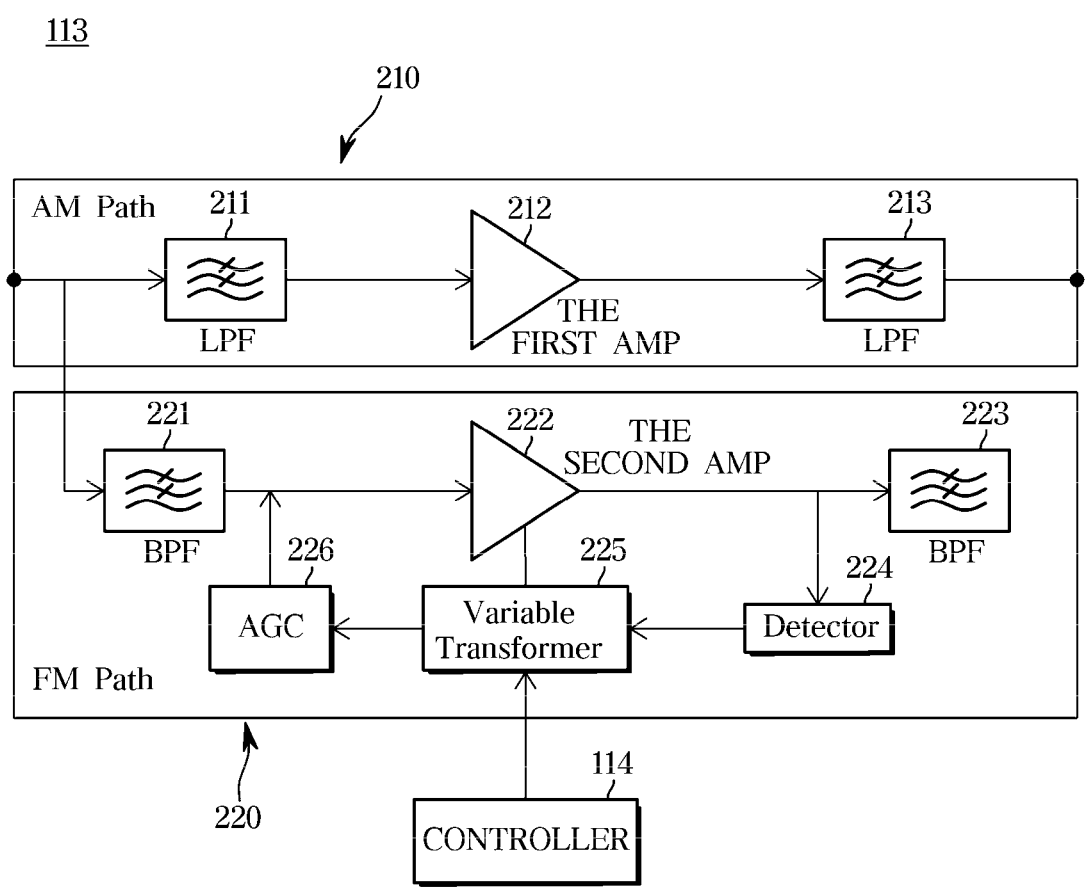
FIG. 2 shows an example of a signal processing unit included in an audio device according to an exemplary embodiment of the present disclosure.
Figure 3:
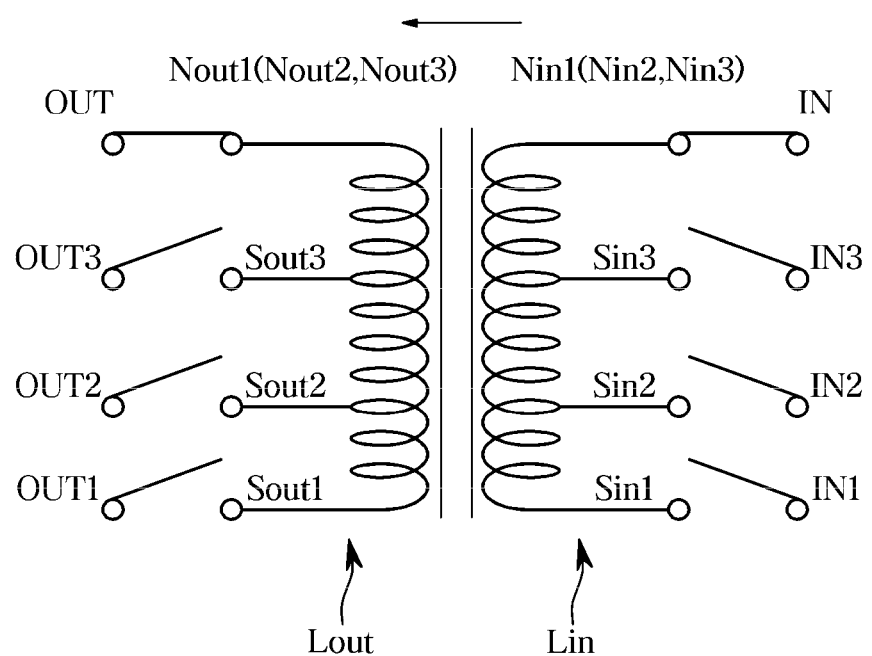
FIG. 3 illustrates an example of a variable transformer included in an audio device according to an exemplary embodiment of the present disclosure.

FIG. 1 is a block diagram of an audio device included in a vehicle according to an exemplary embodiment of the present disclosure. FIG. 2 shows an example of a signal processing unit included in an audio device according to an exemplary embodiment of the present disclosure. FIG. 3 illustrates an example of a variable transformer included in an audio device according to an exemplary embodiment of the present disclosure.

Generally, a vehicle includes a body for forming an appearance and accommodating a driver and/or baggage, a chassis including components of the vehicle 1 other than a vehicle body, and electric loads that protect the driver and provide comfort to the driver.

For example, the electric loads may include an engine management system (EMS), a transmission control unit (TCU), an electronic braking control module (EBCM), motor-driven power steering (MDPS), and the like.

These electric loads can communicate with each other through a vehicle communication network. For example, the electric loads can send and receive data through Ethernet, Media Oriented Systems Transport (MOST), Flexray, Controller Area Network (CAN), Local Interconnect Network (LIN), and the like. Further, the vehicle communication network can employ not only a single communication protocol such as MOST, Flexray, CAN, and LIN, but also a plurality of communication protocols may be employed.

In addition, the electric loads may include an audio device 100 for providing convenience to the driver.

The audio device 100 can provide various information and entertainment to the driver through the sound. For example, the audio device 100 may play an audio file stored in an internal storage medium or an external storage medium according to a command from the driver, and output sound included in the played audio file. Further, the audio device 100 can receive sound data from a user apparatus such as a portable computer, a portable communication apparatus, a portable media player, and the like, and output sound corresponding to the received sound data.

The audio device 100 may receive an audio broadcast signal and output an audio corresponding to the received audio broadcast signal.

As shown in FIG. 1, the audio device 100 includes an antenna module 120 for receiving a broadcast signal, a speaker module 130 for outputting sound by a broadcast signal, and a head unit 110 for extracting an acoustic signal from the received broadcast signal and amplifying the acoustic signal.

The antenna module 120 may include an antenna 121 for receiving a broadcast signal and a low-noise amplifier (LNA) 122 for amplifying the received broadcast signal.

The antenna 121 can receive a broadcast signal from a free space. The broadcast signal may include a signal having a plurality of frequencies. For example, an Frequency Modulation (FM) radio broadcast signal is a broadcast signal of 89.1 MHz, a broadcast signal of 89.7 MHz, a broadcast signal of 91.9 MHz, . . . , a broadcast signal of 107.7 MHz, and the like.

The antenna 121 may include, for example, a glass antenna installed in a rear window of the vehicle.

The LNA 122 can amplify the broadcast signal received by the antenna 121 at a predetermined rate. It is known that the radio signal radiated into the free space sharply decreases as it moves away from the source. The radio signal received by the antenna 121 also has a relatively low intensity, and the LNA 122 can amplify the magnitude of the radio signal to a level that the head unit 110 can discern.

In particular, the LNA 122 may be designed to minimize noise due to amplification, and the LNA 122 may be provided near the antenna 121 so that noise is not added while the signal received by the antenna 121 is transmitted.

As described above, the antenna module 120 can receive the broadcast signal from the free space, amplify the received broadcast signal, and output the amplified broadcast signal to the head unit 110.

The speaker module 130 may include a plurality of speakers 131, 132, and 133 that can convert electrical sound signals output from the head unit 110 into sound. For example, the speaker module 130 may include a high frequency (tweeter speaker) 131 capable of outputting a high frequency sound, an intermediate frequency speaker 132 capable of outputting an intermediate frequency sound, and a low frequency speaker (woofer speaker) 123 capable of outputting a low frequency sound.

Each of the speakers 131, 132, and 133 may be installed at various positions within the vehicle 1. For example, an intermediate frequency speaker 132 is installed on the upper surface of the dashboard 40 of the vehicle 1, and a high frequency speaker 131 and a low frequency speaker 133 are installed on the door 14 of the vehicle 1.

As described above, the speaker module 130 can convert the electrical sound signal output from the head unit 110 into sound and output it.

The head unit 110 includes an input unit 111 for receiving a driver input, a display unit 112 for displaying operation information of the head unit 110, and a signal processor 113 for receiving a broadcast signal from the antenna module 120 and processing a broadcast signal, and a controller 114 for controlling the operation of the head unit 110. In addition, the head unit 110 may further include a media reader for loading media files from an external storage medium, a communication unit for communicating with other electric components 30 of the vehicle 1, and the like.

The input unit 111 may include various types of input means such as a push button, a slide button, and a dial. The input unit 111 may include various input means that can be operated by the driver. For example, the input unit 111 may include a volume dial for adjusting the size of the sound, a channel selection dial for selecting the broadcast frequency of the audio broadcast, a plurality of presets for receiving the audio broadcast of the preset frequency and a play button for playing an audio file stored in an external storage medium.

As described above, the input unit 111 receives an operation command of the driver for the audio device 100, and can output an electrical signal corresponding to the received operation command to the controller 114.

The display unit 112 can display the operation information of the head unit 110 according to the operation of the driver through the input unit 111. For example, when the driver selects the frequency of the broadcast signal through the channel selection dial, the display unit 112 can display the frequency selected by the driver. When the driver inputs a play command of the audio file stored in the external storage medium, the display unit 112 can display the name of the sound source to be played.

The display unit 111 may include various types of display means such as a Liquid Crystal Display (LED), a Light Emitting Diode (LED), and an Organic Light Emitting Diode (OLED).

Here, the display unit 111 can display an image representing the operation information of the head unit 110 according to a control command of the controller 114.

The signal processor 113 includes an AM signal path 210 for processing an Amplitude Modulation (AM) radio signal and a Frequency Modulation (FM) signal path 220 for processing an FM radio signal, as shown in FIG. 2.

The AM signal path 210 includes a first Low Pass Filter (LPF) 211, a first Amplifier (AMP) 212 and a second LPF 213.

The first LPF 211 may pass an AM radio signal having a low frequency band among the AM and FM radio signals received from the antenna module 120, and may block the FM radio signal.

The first amplifier 212 may amplify the AM radio signal that has passed through the first LPF 211. For example, the first AMP 212 may amplify the voltage of the AM radio signal or amplify the current of the AM radio signal.

The second LPF 213 can pass a signal having a low frequency band among the AM radio signals amplified by the first AMP 212.

The FM signal path 220 includes a first band pass filter (BPF) 221, a second AMP 222, a second band pass filter 223, a detector 224, a variable transformer 225, and an auto gain control (AGC) 226.

The first band-pass filter 221 may pass an FM radio signal having a predetermined frequency band from the AM/FM radio signal received from the antenna module 120, and may block the AM radio signal having a low frequency band.

The second AMP 222 may amplify the FM radio signal that has passed through the first band-pass filter 221. For example, the second AMP 222 may amplify the voltage of the FM radio signal or amplify the current of the FM radio signal.

The second band-pass filter 223 can pass a signal having a predetermined frequency band among the FM radio signals amplified by the second AMP 222.

The detector 224 may sense the FM radio signal amplified by the second AMP 222. The detector 224 may deliver a feedback signal to the variable transformer 225 based on the sensed FM radio signal.

The variable transformer 225 can change the magnitude (voltage or current) of the feedback signal and output the changed feedback signal to the AGC 226.

The variable transformer 225, for example, includes an input inductor Lin and an output inductor Lout as shown in FIG. 3.

The input inductor Lin may have a first input turn number Nin1.

The input inductor Lin is connected to an input terminal IN, a first input terminal IN1, and a second input terminal IN2. The input terminal IN is connected to one end of the input inductor Lin, the first input terminal IN1 is connected to the other end of the input inductor Lin through a first input switch Sin1, and the second input terminal IN2 is connected to the middle portion of the input inductor Lin through a second input switch Sin2.

The inductance value of the input inductor Lin can be changed depending on the operation of the first input switch Sin1 and the second input switch Sin2.

Specifically, the number of turns of the input inductor Lin can be changed depending on the operation of the first input switch Sin1 and the second input switch Sin2. For example, if the first input switch Sin1 is open (off) and the second input switch Sin2 is closed (on), the input inductor Lin may have a first input turn number Nin1. When the first input switch Sin1 is closed and the second input switch Sin2 is opened or closed, the input inductor Lin outputs a second input turn number Nin2 smaller than the first input turn number Nin1.

An output inductor Lout may have a first output turn number Nout1. The output inductor Lout is connected to an output terminal OUT, an first output terminal OUT1, a second output terminal OUT2 and a third output terminal OUT3. The output terminal OUT is connected to one end of the output inductor Lout and the first output terminal OUT1 is connected to the other end of the output inductor Lout through a first output switch Sout1. The second output terminal OUT2 is connected to the middle part of the output inductor Lout through a second output switch Sout2 and the third output terminal OUT3 is connected to the output inductor Lout through a third output switch Sout3. The portion where the second output terminal OUT2 is connected to the output inductor Lout is closer to the first output terminal OUT1 than the output terminal OUT and the third output terminal OUT3 is connected to the output inductor Lout is closer to the output terminal OUT1 than the first output terminal OUT1.

The inductance value of the output inductor Lout may be changed depending on the operation of the first output switch Sout1, the second output switch Sout2, and the third output switch Sout3.

Specifically, the number of turns of the output inductor Lout can be changed depending on the operation of the first output switch Sout1, the second output switch Sout2, and the third output switch Sout3. For example, when the first output switch Sout1 is closed and the second and third output switches Sout2 and Sout3 are opened (turned off), the output inductor Lout has the first output turnout Nout1. When the second output switch Sout2 is closed and the first and third output switches Sout1 and Sout3 are opened (turned off), the output inductor Lout has the second output turnout Nout2 which is smaller than the first output turnout Nout1. When the third output switch Sout3 is closed and the first and second output switches Sout1 and Sout2 are opened (turned off), the output inductor Lout has the third output turnout Nout3 which is smaller than the second output turnout Nout2.

Depending on the operation of the first input switch Sin1 and the second input switch Sin2, the first output switch Sout1, the second output switch Sout2 and the third output switch Sout3, the conversion ratio of the variable transformer 225 can be changed.

For example, the variable transformer 225 may have a conversion ratio of Nout1/Nin1 or Nout2/Nin1 or Nout3/Nin1 or Nout1/Nin2 or Nout2/Nin2 or Nout3/Nin2.

Thus, the variable transformer 225 can negatively feedback the output signal of the second AMP 222 to the input signal of the second AMP 222. For example, the variable transformer 225 may reduce the input signal of the second AMP 222 depending on the increase of the output signal of the second AMP 222.

Figure 4:
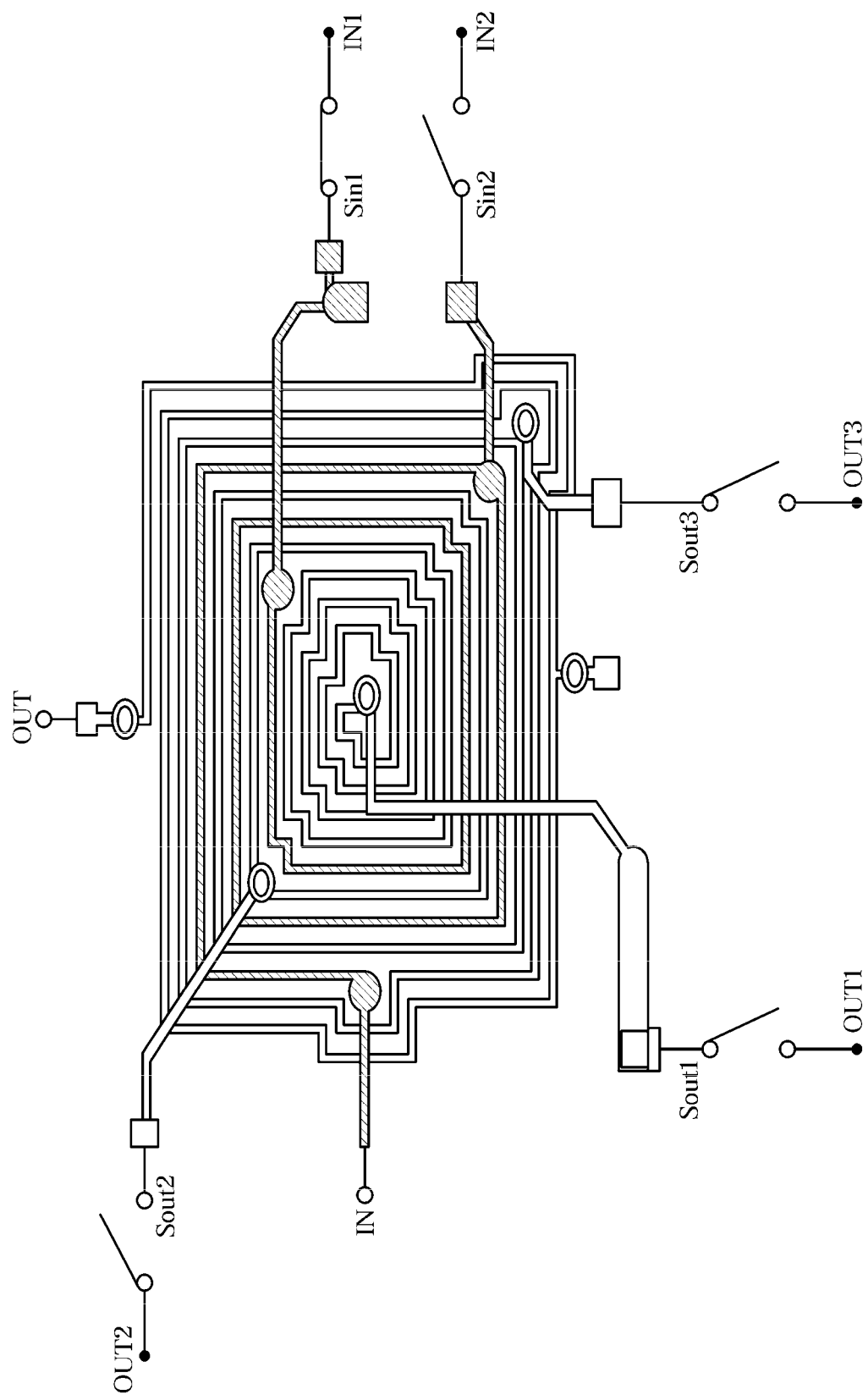
FIG. 4 illustrates an example of a variable transformer included in an audio device according to an exemplary embodiment of the present disclosure.

The input inductor Lin and the output inductor Lout may each include a flat spiral coil formed on the same plane, for example, as shown in FIG. 4.

The AGC 226 may control the FM radio signal received by the antenna module 120 depending on the magnitude of the noise or the magnitude of the output signal. For example, if the magnitude of the FM radio signal amplified by the second AMP 222 is greater than a predetermined reference value, the AGC 226 may reduce the FM radio signal received by the antenna module 120. If the magnitude of the FM radio signal amplified by the antenna 222 is not greater than a predetermined reference value, the FM radio signal received by the antenna module 120 can be passed through.

The AGC 226 may reduce intermodulation noise and prevent the FM radio signal amplified by the second AMP 222 from saturating. Intermodulation phenomena are explained in detail below.

The controller 114 can receive the control command from the driver from the input unit 111 and can control the operation of the display unit 112 and the signal processor 113.

For example, the controller 114 may receive the listening frequency selected by the driver from the input unit 111, and may control the display unit 112 to display an image corresponding to the selected listening frequency. The controller 114 may control the signal processor 113 to extract a broadcasting signal of a listening frequency from the broadcasting signal received by the antenna module 120.

The controller 114 may control the variable transformer 225 and the AGC 226 depending on the magnitude of the noise N-1 and N-2 received through the antenna module 120.

In a free space, various radio signals other than the broadcast signal can be propagated. In particular, the frequency of radio signals available to operators is generally determined by law. Accordingly, the noise (N-1, N-2) received through the antenna module 120 may have a frequency different from the frequency band of the broadcast signal. As described above, the noise (N-1, N-2) having a frequency different from the frequency band of the broadcast signal can be filtered using the filter included in the signal processor 113.

Noise may be generated in the signal processor 113 due to the noise N-1, N-2 even if the noise N-1, N-2 is removed using the band-pass filter, therefore, the noise generated in the signal processor 113 may distort the sound.

The noise generated in the signal processing unit 113 typically includes harmonic noise and intermodulation noise.

Harmonic noise and intermodulation noise may occur while noise (N-1, N-2) passes through the nonlinear element. For example, while noise (N-1, N-2) received through antenna module 120 passes through the AGC 226, a harmonic noise having a frequency corresponding to an integral multiple of the frequency of the noise (N-1, N-2) and intermodulation noise having a frequency corresponding to a combination of the frequencies of the noises (N-1, N-2) may occur.

Figure 5:
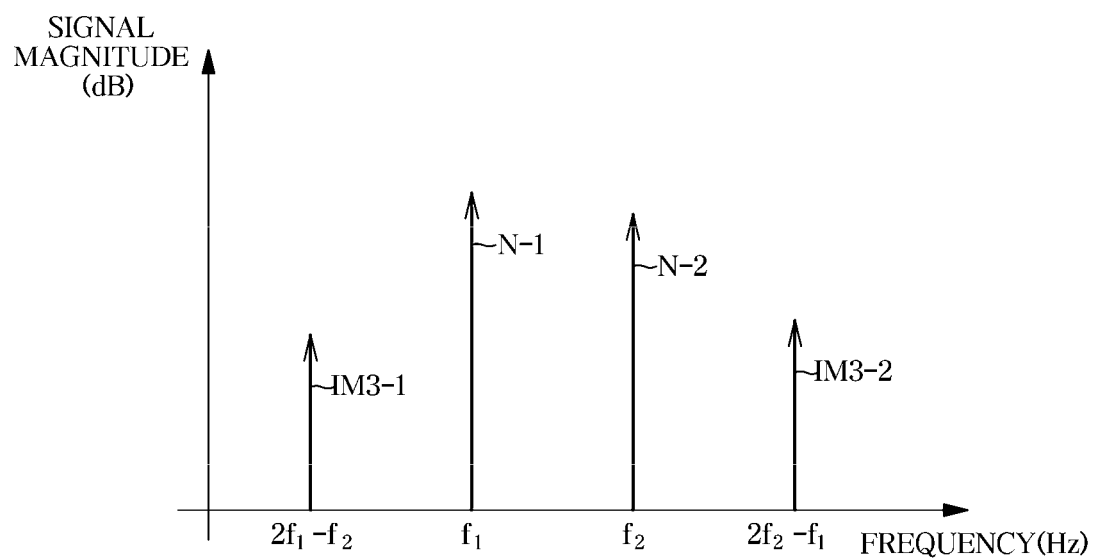
FIG. 5 illustrates noise and intermodulation noise input to an audio device according to an exemplary embodiment of the present disclosure.

For example, if the first noise N-1 of the first frequency f1 and the second noise N-2 of the second frequency f2 are input to the nonlinear element as shown in FIG. 5, a harmonic noise having frequencies (2f1, 3f1, ... ) corresponding to an integral multiple of the first frequency (f1) and a harmonic noise having a frequency 2f2, 3f2, ... corresponding to an integral multiple of the second frequency f2 may be output. In addition, the intermodulation noise having the frequencies f1+f2, f1−f2, 2f1+f2, f1+2f2, 2f1−f2, 2f2−f1, ... in which the first frequency f1 and the second frequency f2 are combined can be output.

The intermodulation noise having frequencies of 2f1−f2 and 2f2-f1 (hereinafter referred to as 'first intermodulation noise' and 'second intermodulation noise', respectively) has a frequency similar to that of the original noise (N-1, N-2). Specifically, as shown in FIG. 5, the frequencies of the first intermodulation noise IM3-1 and the second intermodulation noise IM3-2 are similar to those of the first noise N-1 and the second noise N-2, respectively.

Therefore, if a difference between the frequencies of the noises N-1 and N-2 is not large, there is a possibility that the first intermodulation noise IM3-1 and the second intermodulation noise IM3-2 are similar to the listening frequency. The sound output from the audio device 100 may be distorted due to the first intermodulation noise IM3-1 and the second intermodulation noise IM3-2.

In order to prevent this, the controller 114 may control the variable transformer 225 and the AGC 226 depending on the magnitude and the frequency of the noise signal.

The controller 114 may include a processor and a memory. The memory may store a program and data for controlling the operation of the head unit 110 and the processor may output a control signal for controlling the operation of the head unit 110 according to programs and data stored in the memory.

Figure 6:
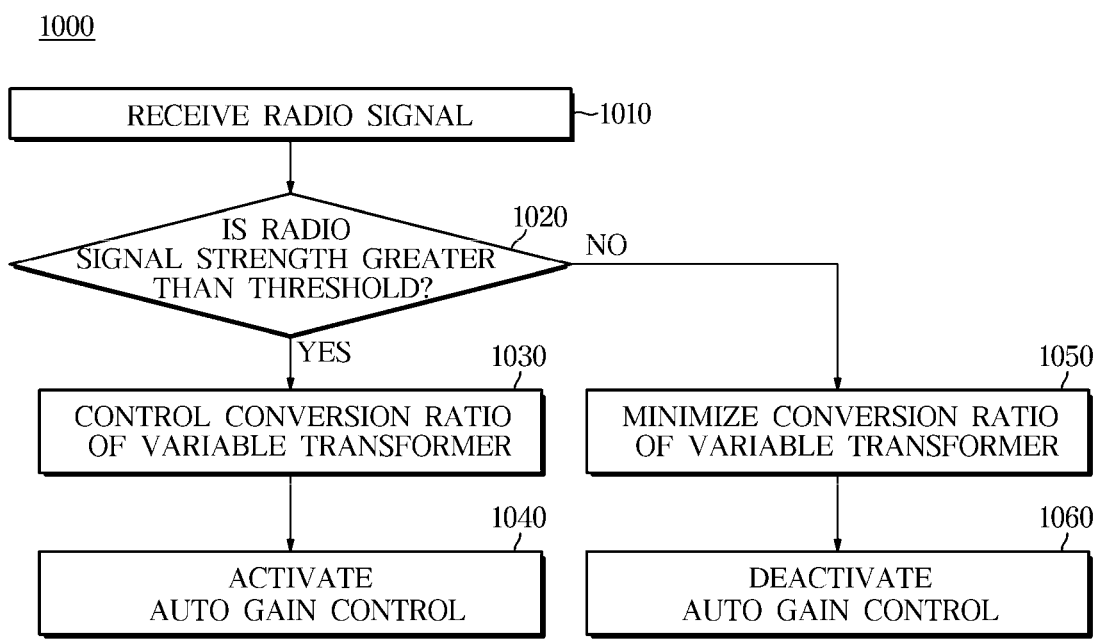
FIG. 6 shows an example of an operation of an audio device according to an exemplary embodiment of the present disclosure.

FIG. 6 shows an example of the operation of an audio device according to an exemplary embodiment of the present disclosure.

With FIG. 6, an operation of the car audio device 100 is described (1000).

The audio device 100 receives a radio signal (1010).

The audio device 100 may receive a radio broadcast signal through the antenna module 120, for example.

The audio device 100, for example, may extract an FM radio signal and/or an AM radio signal from a radio broadcast signal using LPFs 211 and 213 and/or band pass filters 221 and 223.

The audio device 100 determines whether the magnitude of the radio signal is larger than a reference value (1020).

The audio device 100 may amplify the FM radio signal using, a second AMP 222 and detect the amplified FM radio signal using the detector 224.

The controller 114 may receive information about the magnitude of the FM radio signal amplified from the detector 224. The controller 114 compares the magnitude of the amplified FM radio signal with a reference value, and determines whether the magnitude of the amplified FM radio signal is greater than a reference value.

If the magnitude of the radio signal is larger than the reference value (e.g., 1020), the audio device 100 controls the variable transformer 225 depending on the magnitude of the radio signal (1030).

The variable transformer 225, for example, can negatively feedback an output signal of the second AMP 222 to an input signal of the second AMP 222.

If the magnitude of the amplified FM radio signal is larger than the reference value, the controller 114 may control the conversion ratio (the number of output turns/the number of input turns) of the variable transformer 225 depending on, for example, the magnitude of the FM radio signal.

The controller 114 controls the first and second input switches Sin1 and Sin2 and the first/second/third output switches Sout1, Sout2, Sout3 according to the magnitude of the radio signal to control the conversion ratio of the variable transformer 225. For example, the controller 114 may be configured to increase the conversion ratio of the variable transformer 225 depending on the increase in the size of the radio signal by controlling the first and second input switches Sin1 and Sin2 and the first/second/third output switches Sout1, Sout2, Sout3.

By performing negative feedback using the variable transformer 225, the audio device 100 can limit the output signal of the second AMP 222 without reducing the signal-to-noise ratio (SNR).

If the magnitude of the radio signal is larger than the reference value (YES in 1020), the audio device 100 controls the variable transformer 225 (1030) and activates the AGC 226 (1040).

The AGC 226 may control the FM radio signal received by the antenna module 120, for example, depending on the output signal of the second AMP 222.

If the magnitude of the amplified FM radio signal is greater than the reference value, the controller 114 may control the AGC 226 to reduce the magnitude of the FM radio signal input to the second AMP 222. For example, the AGC 226 may reduce the FM radio signal received by the antenna module 120 if the magnitude of the FM radio signal amplified by the second AMP 222 is greater than a predetermined reference value.

As such, the audio device 100 can prevent the output of the second AMP 222 from saturating by using the AGC 226.

If the magnitude of the radio signal is not greater than the reference value (No in 1020), the audio device 100 controls the variable transformer 225 so that the conversion ratio of the variable transformer 225 is minimized (1050).

If the size of the radio signal is not greater than the reference value (No in 1020), the audio device 100 deactivates the AGC 226 (1060).

Therefore, if the noise due to the intermodulation is expected to be small, the audio device 100 may disable the negative feedback and automatic gain control of the output signal of the second AMP 222.

The gain of the second AMP 222 can be controlled based on the output signal of the audio device 100 second AMP 222. If the magnitude of the radio signal is larger than the reference value, the controller 114 can reduce the gain of the second AMP 222. Further, if the magnitude of the radio signal is not greater than the reference value, the controller 114 can maintain the gain of the second AMP 222.

In addition, the audio device 100 may independently control the gain of the second AMP 222 and the conversion ratio of the variable transformer 225, or the control of the gain of the second AMP 222 in conjunction with the control of the conversion ratio of the variable transformer 225

The computer-readable recording medium includes all kinds of recording media in which instructions that can be decoded by a computer. For example, there may be read only memory (ROM), random access memory (RAM), a magnetic tape, a magnetic disk, a flash memory, an optical data storage device, and the like.

It is an aspect of the present disclosure to provide a vehicle and a control method thereof capable of attenuating identifying an electric load consuming a current in a parking state.

It is an aspect of the present disclosure to provide a vehicle and a control method thereof capable of attenuating noise while maintaining a signal-to-noise ratio.

Although example embodiments of the disclosure have been shown and described, it would be appreciated by those skilled in the art that changes may be made to these embodiments without departing from the principles and spirit of the disclosure, the scope of which is defined in the claims and their equivalents.

What is claimed is:

1. A vehicle, comprising:
 an antenna configured to receive a broadcast signal;
 an amplifier configured to amplify the broadcast signal;
 a detector configured to detect an output signal of the amplifier;
 a variable transformer configured to output a negative feedback signal based on the detected output signal;

an auto gain control configured to control an input signal of the amplifier based on the negative feedback signal; and a controller configured to control the variable transformer and the auto gain control based on the output signal of the amplifier.

2. The vehicle of claim 1, wherein the variable transformer converts the detected output signal into the negative feedback signal based on a conversion ratio by a control signal of the controller.

3. The vehicle of claim 1, wherein the controller changes the conversion ratio of the variable transformer based on the output signal of the amplifier.

4. The vehicle of claim 3, wherein, if a magnitude of the output signal of the amplifier is greater than a reference value, the controller changes the conversion ratio of the variable transformer depending on the magnitude of the output signal of the amplifier, and wherein, if the magnitude of the output signal of the amplifier is not greater than the reference value, the controller controls the variable transformer such that the conversion ratio of the variable transformer is reduced.

5. The vehicle of claim 1, wherein the auto gain control adjusts the input signal of the amplifier such that the detected output signal is not saturated.

6. The vehicle of claim 1, wherein the controller activates or deactivates the auto gain control based on the output signal of the amplifier.

7. The vehicle of claim 6, wherein, if a magnitude of the output signal of the amplifier is greater than a reference value, the controller activates the auto gain control, and wherein, if the magnitude of the output signal of the amplifier is not greater than the reference value, the controller deactivates the auto gain control.

8. The vehicle of claim 1, wherein the variable transformer includes an input inductor and an output inductor which are magnetically correlated to each other, and wherein inductance values of the input inductor and the output inductor are changed in response to a control signal of the controller.

9. The vehicle of claim 8, wherein the variable transformer includes:

a plurality of input switches each connected to one end of the input inductor and a middle portion of the input inductor; and a plurality of output switches each connected to one end of the output inductor and a middle portion of the output inductor.

10. The vehicle of claim 9, wherein, in response to the control signal of the controller, the inductance values of the input inductor and the output inductor, respectively, are changed depending on an operation of the plurality of input switches and the plurality of output switches.

11. The vehicle of claim 1, wherein the controller adjusts a gain of the amplifier based on the negative feedback signal.

12. The vehicle of claim 11, wherein the controller adjusts the gain of the amplifier based on the negative feedback signal, and the controller changes the conversion ratio of the variable transformer based on a gain control of the amplifier.

13. A control method of a vehicle, comprising:

receiving a broadcasting signal;

amplifying the broadcasting signal by an amplifier;

detecting an output signal of the amplifier;

converting the output signal of the amplifier to a negative feedback signal by a variable transformer; and adjusting an input signal of the amplifier in response to a negative feedback signal, wherein the converting comprises:

changing a conversion ratio of the variable transformer if a magnitude of the output signal of the amplifier is greater than a reference value; and reducing the conversion ratio of the variable transformer if the magnitude of the output signal of the amplifier is not greater than the reference value.

14. The control method of claim 13, wherein, in the converting, the output signal of the amplifier is converted to the negative feedback signal based on the conversion ratio determined from the output signal of the amplifier.

15. The control method of claim 13, wherein the variable transformer includes an input inductor and an output inductor magnetically correlated to each other, and wherein the converting the output signal comprises changing inductance values of the input inductor and the output inductor.

16. The control method of claim 15, wherein the variable transformer includes:

a plurality of input switches each connected to one end of the input inductor and a middle portion of the input inductor; and a plurality of output switches each connected to one end of the output inductor and a middle portion of the output inductor, and wherein the inductance values of the input inductor and the output inductor, respectively, are changed depending on an operation of the plurality of input switches and the plurality of output switches.

17. The control method of claim 13, wherein, in the adjusting, the input signal of the amplifier is adjusted such that the output signal is not saturated.

18. The control method of claim 13, the adjusting comprises activating or deactivating an auto gain control based on the output signal of the amplifier.

19. The control method of claim 18, wherein, in the adjusting, the auto gain control is activated if the magnitude of the output signal of the amplifier is greater than the reference value, and the auto gain control is deactivated if the magnitude of the output signal of the amplifier is not greater than the reference value.

* * * * *